(12) United States Patent
Madan et al.

(10) Patent No.: US 6,488,777 B2
(45) Date of Patent: Dec. 3, 2002

(54) SEMICONDUCTOR VACUUM DEPOSITION SYSTEM AND METHOD HAVING A REEL-TO-REEL SUBSTRATE CASSETTE

(75) Inventors: Arun Madan, 327 Lamb La., Golden, CO (US) 80401; Jeffrey Owen Heng, Lakewood, CO (US)

(73) Assignee: Arun Madan, Golden, CO (US)

( * ) Notice: Subject to any disclaimer, the term of this patent is extended or adjusted under 35 U.S.C. 154(b) by 70 days.

(21) Appl. No.: 09/825,112

(22) Filed: Apr. 3, 2001

(65) Prior Publication Data

US 2001/0055888 A1 Dec. 27, 2001

Related U.S. Application Data

(62) Division of application No. 09/598,881, filed on Jun. 21, 2000.
(60) Provisional application No. 60/142,374, filed on Jul. 6, 1999.

(51) Int. Cl.[7] ............................................. C23C 16/00
(52) U.S. Cl. ..................................................... 118/718
(58) Field of Search ........................................ 118/718

(56) References Cited

U.S. PATENT DOCUMENTS 3,623,586 A    11/1971  Shellabarger
4,542,711 A  * 9/1985  Izu ............................. 118/718
4,677,738 A    7/1987  Izu et al.

* cited by examiner

Primary Examiner—Richard Bueker
(74) Attorney, Agent, or Firm—Holland & Hart LLP; Francis A. Sirr, Esq.

(57) ABSTRACT

A substrate cassette contains two physically spaced and parallel reels. A relatively long web of flexible substrate material is wound about one reel and the exposed end of the web is connected to the other reel, to thus expose a relatively short length of the substrate material at a deposition-plane that lies between the two reels. A first idler roller is associated with the first reel, a second idler roller is associated with the second reel, and the web is guided by the two idler rollers as the web moves between the two reels. The two idler rollers are mounted at fixed positions in order to accurately establish a fixed-position deposition-plane. The substrate cassette is placed within one or more vacuum deposition chambers, the web is advanced between the two reels, and one or more semiconductor layers are deposited on substantially the entire length of the web. A protective layer is provided as part of the web in order to protect the semiconductor layer(s) when the web is wound unto a take-up reel. A constant tension is maintained in the web as the web advances from one reel to the other. The two opposite ends of the web are clamped to the two reels by the operation of an axially-split cylindrical cover that covers each reel and is compressed down onto each web end.

5 Claims, 8 Drawing Sheets

SEMICONDUCTOR VACUUM DEPOSITION SYSTEM AND METHOD HAVING A REEL-TO-REEL SUBSTRATE CASSETTE

CROSS-REFERENCE TO RELATED APPLICATION

This is a division of co-pending application Ser. No. 09/598,881, filed on Jun. 21, 2000.

This application claims the priority date of copending provisional patent application Ser. No. 60/142,374 filed on Jul. 6, 1999 for CLUSTER TOOL VACUUM DEPOSITION SYSTEM HAVING A REEL-TO-REEL SUBSTRATE CASSETTE

BACKGROUND OF THE INVENTION

1. Field of the Invention

This invention relates to the field of material deposition, and more specifically, to the deposition of one or more semiconductor layers/films onto a substrate member.

2. Description of the Related Art

It is known in the field of semiconductor manufacturing that semiconductor material be selectively deposited onto a substrate member. In so doing, it is known that an in-line horizontal, and in-line vertical, or a circular assembly of vacuum deposition chambers may be used wherein the substrate member is sequentially moved from one chamber to another as is needed to achieve a desired sequence of semiconductor layers on the substrate member.

It is usual that the limited internal volume of a vacuum deposition chamber limits the physical size of a substrate member that can be inserted into the chamber(s), and upon which semiconductor material may be deposited.

It would be desirable to provide a means whereby a substrate holder would enable a larger area of substrate to be operated upon by a deposition chamber(s).

SUMMARY OF THE INVENTION

This invention provides a substrate cassette for use in a single chamber deposition system for use in an in-line multiple chamber deposition system, and for use in a circular multiple chamber or cluster tool deposition system.

A substrate cassette in accordance with this invention contains two physically spaced and parallel reels, either of which can be designated as the supply reel, whereupon the other reel becomes the take-up reel. A relatively long and linear web of flexible substrate material (for example, a stainless steel or plastic substrate material that is about 0.003-inches thick), about 1-foot wide and about 100-feet long, is wound about the supply reel, and the 1-foot wide exposed end of the web is connected to the take-up reel. In this way, a relatively short length (for example, 1-foot by 1-foot square) of the substrate material is supported in a deposition plane, usually either vertical or a horizontal plane, that lies between the supply reel and the take-up reel.

In an embodiment of the invention, a protective backing web is provided adjacent to the back side of the substrate web, this protective web operating to protect a deposition layer(s) that is carried by the deposition side of the substrate web.

In an embodiment of the invention wherein a single layer of a semiconductor material is to be deposited on substantially the entire 100-foot length of the substrate web, the substrate cassette of the invention is placed in a deposition chamber, and a relatively short 1-foot length of the substrate is exposed to the deposition volume of the deposition chamber. A reel-to-reel servo system then operates to advance the substrate from the supply reel to the take-up reel at a relatively slow but constant speed, while maintaining a constant tension in the web, as substantially the entire 100-foot length of the substrate web receives a deposited layer; for example, a semiconductor layer, onto one side surface of the web. The end result is a take-up reel having about 100 feet of substrate material that contains a single deposition layer.

Embodiments of the invention provide for the deposition of multiple layers onto the long substrate web.

In a first embodiment wherein multiple layers are produced, a first layer is deposited on the entire 100 foot length of the substrate web as above described. The substrate web is then rewound from the take-up reel back onto the supply reel, and the above-described process is repeated in order to deposit a second and usually different layer onto the first layer. Of course, this process can be repeated N times in order to deposit N layers onto the 100 foot length of the substrate web. While it may be preferred to rewind the substrate web between use of the cassette in another deposition chamber, it is within the spirit of the invention to eliminate this rewind step, and to rewind the substrate web from the take-up reel to the supply reel as deposition of a second layer is taking place in the second deposition chamber.

In a second embodiment wherein multiple layer structures are produced, the substrate cassette of the invention is placed in a first deposition chamber, and a relatively short length of the substrate is exposed to the deposition volume of the first deposition chamber. A first layer is then deposited on this first length of the substrate web. The cassette is then moved to a second deposition chamber, and a second layer is deposited on the substrate's first length of the substrate web. In this manner, the cassette is moved between a number of deposition chambers as a like number of layers are deposited on the first length of the substrate web. Once all layers have been deposited on the first length of the substrate web, a reel-to-reel servo system operates to step advance the substrate web to expose a second length of the substrate at the deposition operative position between the two reels. The cassette is then recycled through the deposition chambers to produce a second multiple layer structure on the substrate second length. In this embodiment of the invention, when the substrate has been completely wound from the supply reel to the take-up reel, the take-up reel contains a number of individual substrate areas, each individual substrate area containing one multiple layer structure. For example, when the substrate web is about 100-feet long and about 1 foot wide, and when each individual substrate deposition length is about 1 foot long, the finished web contains as many as 100 individual multiple layer structures, each measuring about 1 foot by 1 foot.

In a preferred embodiment of the invention, a number of vacuum deposition chambers are mounted in a generally circular configuration so as to occupy a generally common horizontal plane, and a centrally-located vacuum chamber contains a robotic arm that is mounted at a central location relative to the deposition chambers. This robotic arm periodically rotates in the common plane to thereby step transport the substrate cassette from one deposition chamber to another deposition chamber, as multiple layers are vacuum deposited on the substrate member. In another embodiment of the invention, the multiple vacuum deposition chambers are arranged in a generally linear or in-line fashion, either horizontal or vertical, and a transport means operates to step transport the substrate cassette through the deposition chambers.

A non-limiting use of a single vacuum chamber deposition system is in the manufacture of a thin semiconductor, such as an amorphous silicon layer, a thin film amorphous silicon alloy layer, a micro-crystalline silicon, or a polycrystalline silicon layer on a relatively long/narrow and inert substrate web.

A non-limiting example of the use of such a linear or circular vacuum deposition chamber configuration is in the manufacture of n-i-p semiconductor structures, such as amorphous silicon, micro-crystalline silicon or polycrystalline type semiconductor on a relatively long/narrow and inert substrate web. In this use, a first vacuum chamber is used to deposit a n-type layer on the substrate member, a second vacuum chamber is used thereafter to deposit an intrinsic layer on the n-type layer, and a third vacuum chamber is used thereafter to deposit a p-type layer on the intrinsic layer, or three such vacuum chambers can be used in the opposite sequence to produce p-i-n semiconductor structures.

As will be appreciated, deposition chambers other than those above described can be used, as desired, in order to manufacture virtually any type of semiconductor structure. For example, a deposition chamber can be used to deposit a first metal contact layer on the substrate web prior to deposition of the above described first semiconductor layer, and yet another vacuum deposition chamber can be used to deposit a second metal contact layer on the last semiconductor layer; for example, by using techniques such as, but not limited to, metal vapor deposition and metal evaporation.

The present invention provides a new and unusual substrate cassette or substrate magazine physical format that contains a relatively long, narrow and flexible substrate web that is length advanced through a single station deposition system, or through the various stations of a multiple station deposition system.

While the substrate cassette of this invention finds utility in both single station vacuum deposition systems and multiple station vacuum deposition systems, the spirit and scope of this invention is not to be limited thereto, since substrate cassettes of this invention are useful in virtually any deposition system wherein a layer is deposited on the substrate web as the substrate web moves from a first reel, through a deposition area, and then onto a second reel.

As a feature of the present invention, the substrate cassette of the invention includes a first idler roller that is associated with the first reel, and a second idler roller that is associated with the second reel. While the effective diameters of the two reels change as the substrate web moves from one reel to the other, the substrate web is guided by the two idler rollers as it moves between the two reels, and the two idler rollers are structurally mounted to accurately establish a deposition plane whereat deposition takes place along substantially the entire length of the substrate web.

As another feature of the present invention, each of the two reels within the substrate cassette is driven by its own electrical motor, and these two motors are servo-controlled so as to maintain a constant tension within the relatively short length of the substrate web that extends between the two idler rollers, thus ensuring that this short length of the substrate web is always maintained in one, non-varying, deposition plane.

As a feature of the invention the two ends of the substrate web are clamped to the respective two reels by the operation of an axially split cylindrical cover that is radially compressed to capture an end of the substrate web against the underlying cylindrical surface of a reel.

These and other features and advantages of the invention will be apparent to those of skill in the art upon reference to the following detailed description, which description makes reference to the drawing.

DESCRIPTION OF THE PREFERRED EMBODIMENT

Figure 1:
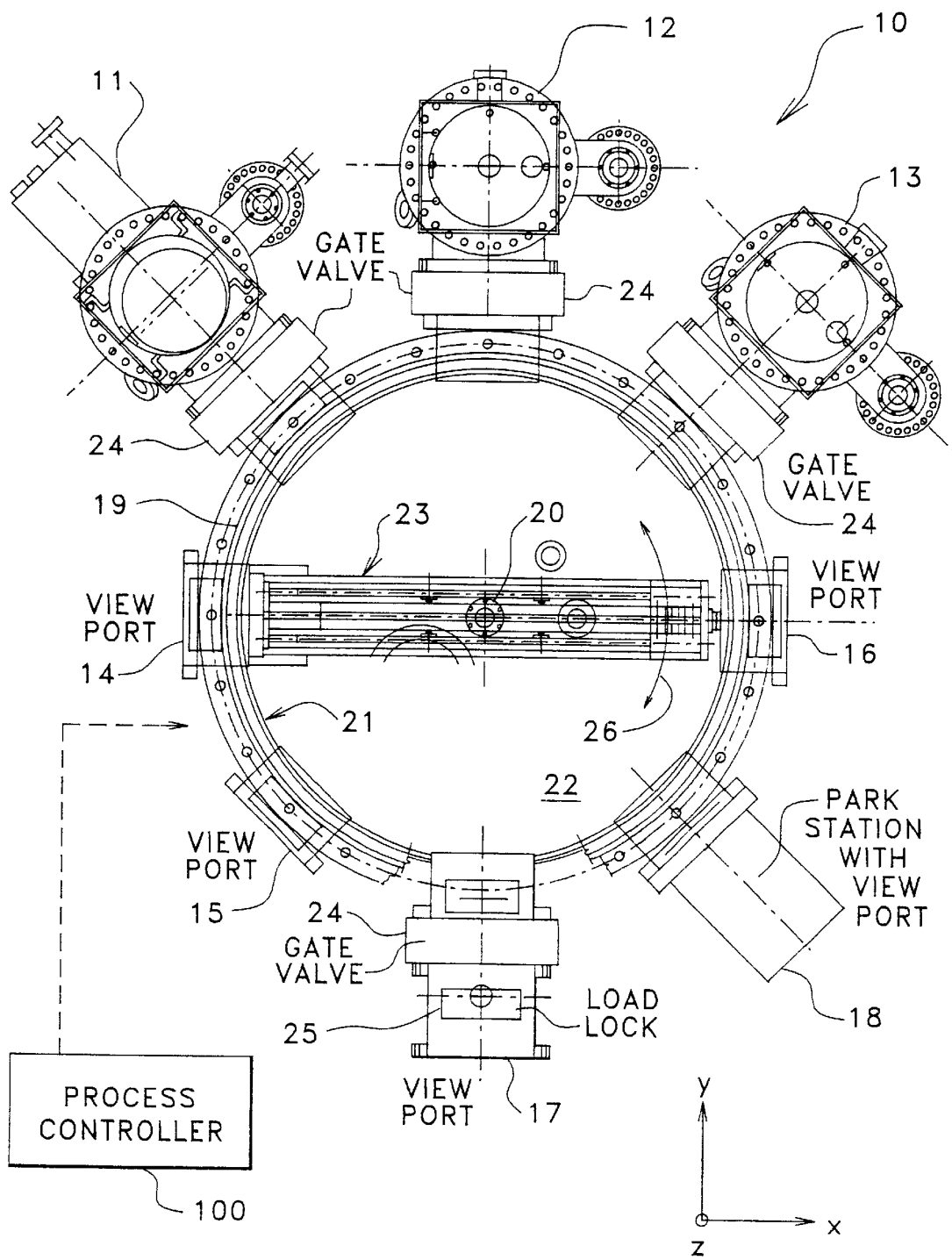
FIG. 1 is a top view of a circular, multiple chamber, vacuum deposition system having three vacuum deposition chambers, three view port stations, a combination load lock and park station, and a second park station in accordance with the invention, and in which the substrate cassette of the invention finds utility.

FIG. 1 is a top view of a circular, multiple chamber, vacuum deposition system 10 having three vacuum deposition chambers 11, 12 and 13, three view port stations 14, 15 and 16, a load lock station 17, and a second park station 18.

The eight above-mentioned stations 11–18 are mounted or located generally in the horizontal or X-Y plane of FIG. 1, and stations 11–18 are located generally on a common circle 19 having a central axis 20 that extends in the vertical or Z-direction of FIG. 1. Circle 19 is generally defined by the circular cylinder wall 21 of a centrally-located and generally disk-shaped vacuum chamber 22 that is about 24-inches high (the Z direction), and that contains a bi-directionally rotatable robotic arm 23 of conventional and well-known construction that is rotatable about axis 20 and in the horizontal X-Y plane of FIG. 1, this rotation being represented by arrow 26. Robotic arm 23 includes an article grasping end (not shown) that is configured in a well-known manner to cooperated with the substrate cassette of this invention.

While not shown, a video system is provided within centrally-located vacuum chamber 22 to enable the process to be monitored from that viewpoint.

With reference to viewing stations 14, 15 and 16, these three stations include a generally vertically-extending transparent window by which an operator may view internal operations that are taking place within centrally-located vacuum chamber 22, and each of these three stations are adapted to expand, or retrofit, the station content of the FIG. 1 system by placing an additional vacuum deposition chamber at one or more of the viewing stations 14, 15, 16. In the alternative, some or all of the stations 14, 15 and 16 may comprise other types of cassette processing chambers.

With reference to stations 11, 12, 13, and 17, each of these four stations comprise a vacuum chamber that includes a gate valve 24. Gate valves 24 are sealed to centrally-located vacuum chamber 22, and enable robotic arm 23 to transport a cassette from central vacuum chamber 22 to a selected one of the deposition vacuum chambers 11, 12, 13, 17, without subjecting the cassette and the various vacuum chambers to contamination or cross contamination As will be appreciated by those skilled in the art, rotation of robotic arm 23 and operation of gate valves 24, is computer controller and synchronized by way of an associated process computer 100.

In addition, it is quite likely that the individual radially located vacuum chambers 11, 12, 13 operate at different vacuum (i.e., below atmospheric) pressures, and at vacuum pressures that are different than the vacuum pressure that is within centrally-located vacuum chamber 22. The process control of the FIG. 1 arrangement may also be computer controlled at 100 to equalize the vacuum pressure across any given gate valve 24, before that gate valve is opened for access by robotic arm 23.

The deposition method or methods that operate within each of the three vacuum deposition chambers 11, 12 and 13 are not critical to this invention, and may include sputter deposition, reactive sputter deposition, evaporative deposition, reactive evaporative deposition, Glow Discharge (GD), Chemical Vapor Deposition (CVD), Hot Wire Chemical Vapor Deposition (HWCVD), Plasma Enhanced Chemical Vapor Deposition (PECVD), annealing, planarization, MOCVD, and the like.

Utility of the invention relative to PECVD includes, but is not limited to, amorphous silicon (p, i and n) wherein the intrinsic layer may be SiH, a-SiFH, a-SiGe:H, etc.; microcrystalline silicon, intrinsic and doped (n and p type) Si, C, SiC, SiGe, SiN, SiONx; hard coatings such as a-C, a-BN, etc.; optical coatings; and electrochromic devices. Such a PECVD technique can employ, but is not limited to, a fixed frequency of 13.56 MHz, a high excitation frequency in the range of about 13.56 MHz to about 150 MHz, it can employ DC or any frequency from DC to the GHz range, the plasma can be modulated or a pulsed plasma technique can be used, or the plasma in the PECVD can be remote.

The utility of the invention relative to sputtering includes, but is not limited to, metallization such as Ni, Mo, Ag, Al, NiCr, etc.; transparent conducting oxides such as ITO, ZnO, etc.; coatings such as C, BN, anti-reflective coating such as MgF, SiNx, SiONx and SiOx; transparent conducting oxides, and sputtering can employ either DC or a variable frequency in the DC to the GHz range. These materials are fabricated using a suitable target and using Ar, O2 and other types of reactant gases, such as H2.

Relative to hot wire or catalytic CVD utility, the following, but without limitation thereto, can be produced, amorphous silicone (p, i and n) wherein the intrinsic layer can be a-SiH, a-SiFH, a-SiGe:H, etc.; microcrystalline silicon, intrinsic and doped (n and p type) Si, C, SiC, SiGe, SiN and SiONx; and dielectric layers including silicon nitride, silicon oxide, silicon oxy-nitride, etc.

Relative to the evaporation process utility, the sources can be spot, either single or multiple or line sources. Materials to be deposited include any metals, CIS, individually or as compounds, and including gallium, CdTe, individually or as compounds, and oxides such as silicon oxide, ITO, ZnO, SiNx, SiONx, etc.

Relative to the MOCVD utility, such utility includes materials such as GaAs, GaN, ZnP, CdS, InP, etc., either deposited singly or as compounds using different gases and liquid type sources.

Relative to the annealing utility of the invention, materials produced can be post-deposition that is treated with a heat source, such as lamps, IR, etc., in order to obtain desired properties.

In addition, suitable combinations of process chambers and process technology, with suitable patterning, apply to solar cells, including but not limited to amorphous silicon, microcrystalline silicon, thin film silicon, and related alloys that may include Ge, C, N and/or F, thin film transistors with doped layers, with SiNx as the gate dielectric, and which may include SiNx as the passivation layer, or in an inverse configuration; imaging devices using a p-i-n or a p-n configuration; solar cells using a CdTe or a CIS configuration; electrochromic devices; hard coatings; and optical coatings in single or multi-layer configurations.

Relative to load lock station 17 of FIG. 1, this station includes an input load lock 25 that facilitates the manual or automatic input or removal of a cassette into or out of deposition system 10. In either case, the pressure within load lock station 17 is controlled to be at ambient atmospheric pressure for either a cassette load or a cassette unload operation, and before input load lock 25 is opened.

After a cassette has been loaded into load lock station 17, input load lock 25 is closed. The vacuum in chambers 17 and 22 is then equalized, and the gate valve 24 that lies between these two chambers is opened. Robotic arm 23 now enters chamber 25, the article grasping end of robotic arm 23 physically grasps or lifts the cassette, and robotic arm 23 withdraws the cassette to chamber 22 whereupon the gate valve is closed.

Assuming that the cassette is now to be placed in deposition chamber 11, it may be that the operator first wishes to inspect the cassette and/or the cassette-to-robotic arm physical association. If so, robotic arm 23 is rotated to position the cassette at viewing station 14 and/or 15. Robotic arm 23 now rotates to the position of deposition chamber 11, whereupon the vacuum within chambers 22 and 11 is equalized. The gate valve 24 that is associated with chambers 22 and 11 is now opened, and robotic arm 23 deposits the cassette in an operative position within chamber 11. This gate 24 now closes, the vacuum within chamber 11 is changed to whatever is required by the deposition process that in operative in chamber 11, and vacuum deposition on the substrate begins.

After the cassette has progressed through all deposition chambers, the finished product cassette may be placed in park station 18, by operation of robotic arm 23; for example, for visual inspection, park station 18 being at the same vacuum pressure as centrally-located vacuum chamber 22.

In the case of a cassette unload operation, the vacuum within chambers 22 and 17 is equalized, the associated gate 24 is opened, the finished product cassette is placed in load lock station 17 by operation of robotic arm 23, and the associated gate valve 24 is closed, all of these steps occurring with input load lock 25 is in its closed position. The vacuum within load lock station 17 is now controlled to be generally equal to ambient atmospheric pressure, whereupon input load lock 25 is opened, and the finished product cassette is removed.

Non-limiting uses of the FIG. 1 system include the fabrication of high quality amorphous, micro-crystalline, and poly-crystalline thin film silicon and related materials, devices and modules on a substrate member. As will be apparent, in accordance with this invention such materials, devices and modules are fabricated on a flexible substrate member or web. As will be apparent, the present invention is also applicable to virtually any technology where electronic devices are desirable on a flexible substrate.

Figure 2:
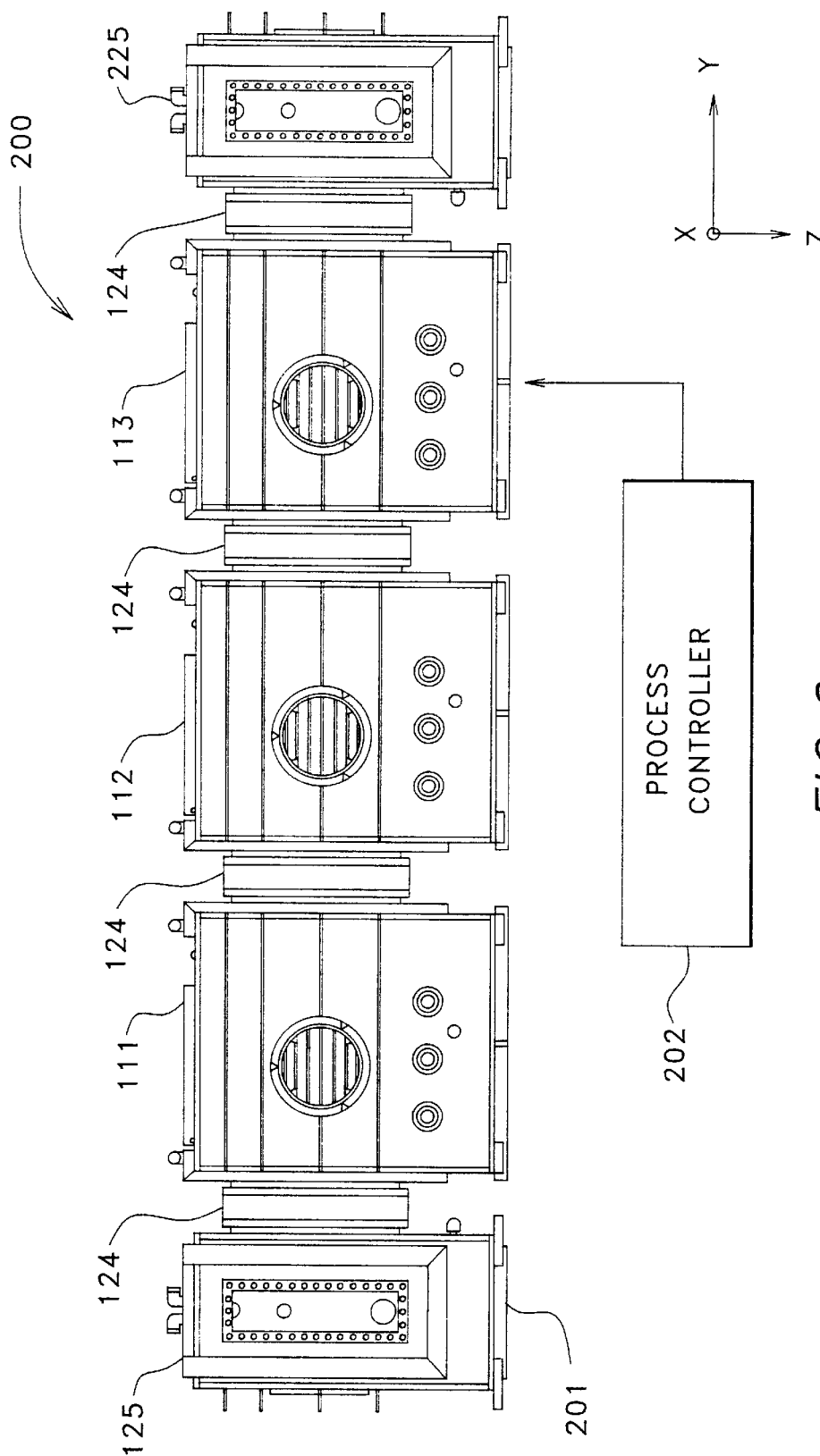
FIG. 2 is a side view of a linear, multiple chamber, vacuum deposition system having three vacuum deposition chambers, an entry combination load lock and park station, and an exit combination load lock and park station in accordance with the invention and in which the substrate cassette of the invention finds utility.

FIG. 2 is a side or Y-Z plane view of a linear, multiple chamber, vacuum deposition system 200 having three vacuum deposition chambers 111, 112 and 113, an entry load lock 125, and an exit load lock station 225 in accordance with the invention, and in which the substrate cassette of the invention finds utility. As shown in FIG. 2, the various stations of system 200 are separated by gate valves 124, a substrate cassette transport means 201 is provided to transport the substrate cassette between the various stations of FIG. 2, and a process controller 201 is provided to control system 200 and its substrate cassette in much the same manner as described above relative to FIG. 1.

The present invention provides a new and unusual substrate cassette or substrate magazine physical configuration for containing a relatively long, narrow and flexible substrate web that is used in deposition systems such as above described relative to FIGS. 1 and 2.

The systems of FIGS. 1 and 2 are conventionally used with a relatively small and rigid substrate member. However, in accordance with this invention, a relatively long, narrow and flexible substrate web that is contained within a roll-to-roll or reel-to-reel cassette or magazine is provided for use in depositions systems of these general types. Non-limiting examples of such a substrate web include polyemide foil, stainless steel foil, and the like that are about 1 foot wide and about 100 feet long. Of course, within the spirit and scope of this invention the substrate web can be longer/shorter or narrower/wider, as desired.

The two physically spaced reel ends of the cassette respectively contain a supply reel/spool and a take-up reel/spool that are mounted to rotate on fixed position and parallel axis. These two reels are physically spaced so as to expose a relatively short deposition operative run or length of the web; for example, a 1 foot by 1 foot web area that extends between the two reels. This deposition operative substrate run is held under tension by virtue of two servo-controlled drive motors that are connected one motor to each of the two reels. These two drive motors are servo controlled to advance the substrate web between a supply reel and a take-up reel, while at the same time maintaining a constant tension in the web.

In one embodiment of the invention, the cassette is placed in a deposition chamber, and the substrate web is thereafter fed at a controlled and continuous speed, or at a controlled step-by-step speed, from the supply reel to the take-up reel as a layer is deposited on the substrate web. In this case, the finished product comprises a single deposition layer; for example, a single semiconductor layer.

In another embodiment of the invention, the cassette is placed in a first deposition chamber, and the substrate web is thereafter fed at a controlled and continuous speed, or at a controlled step-by-step speed, from the supply reel to the take-up reel as a first layer is deposited on one side of the substrate web.

The cassette is then removed from the first deposition chamber (for example, to the centrally-located chamber 22 of FIG. 1). Somewhere in the course of this operation (the place not being critical to the invention), the substrate web is rewound from the take-up reel back onto the supply reel.

The rewound cassette is then placed in a second deposition chamber, and the above-described process is repeated to thereby deposit a second layer on the first deposited layer. As will be appreciated, this process can be repeated in order to deposit multiple layers onto the substrate web. In this case, the finished product is a multiple layer product.

The above two embodiments of the invention require that the substrate web be advanced from the supply reel to the take-up reel during deposition, or between deposition chambers. As will be appreciated by those of skill in the related art, the speed at which the substrate web is advanced from the supply reel to the take-up reel is controlled in accordance with the deposition process that is operating within each of the various deposition chambers.

In yet another embodiment of the invention, a multiple layer product may be produced as above described, wherein each individual short substrate run that extends between the supply and take-up reels is operated on to produce multiple layers, whereupon the substrate web is step advanced, and the process is repeated. In this embodiment of the invention, a rewind movement of the substrate web during deposition is not required, and a rewind of the substrate web is not required between deposition chambers.

The use of a flexible substrate web as above described wherein a relatively long and narrow substrate web (for example, a substrate web that is 100 feet long and 1 foot wide) is fed at a controlled speed through various deposition stations to produce electronic devices, such as solar cells, thin film transistors, imaging devices or X-ray detectors has been found to be highly desirable. The present invention provides that cross-contamination of deposited layers is prevented. Since the layer deposition rates and the layer thickness of the various depositions may differ, both the speed of movement of the substrate web through the deposition areas and the physical length of the deposition areas as measured in the direction of this movement may be controlled as desired.

While physical size is not critical to the invention, in an embodiment of the invention, circle 19 of FIG. 1 was about 3-feet in diameter, and the various peripheral chambers were generally cube-shaped and had a volume of about 50 liters.

Figure 3:
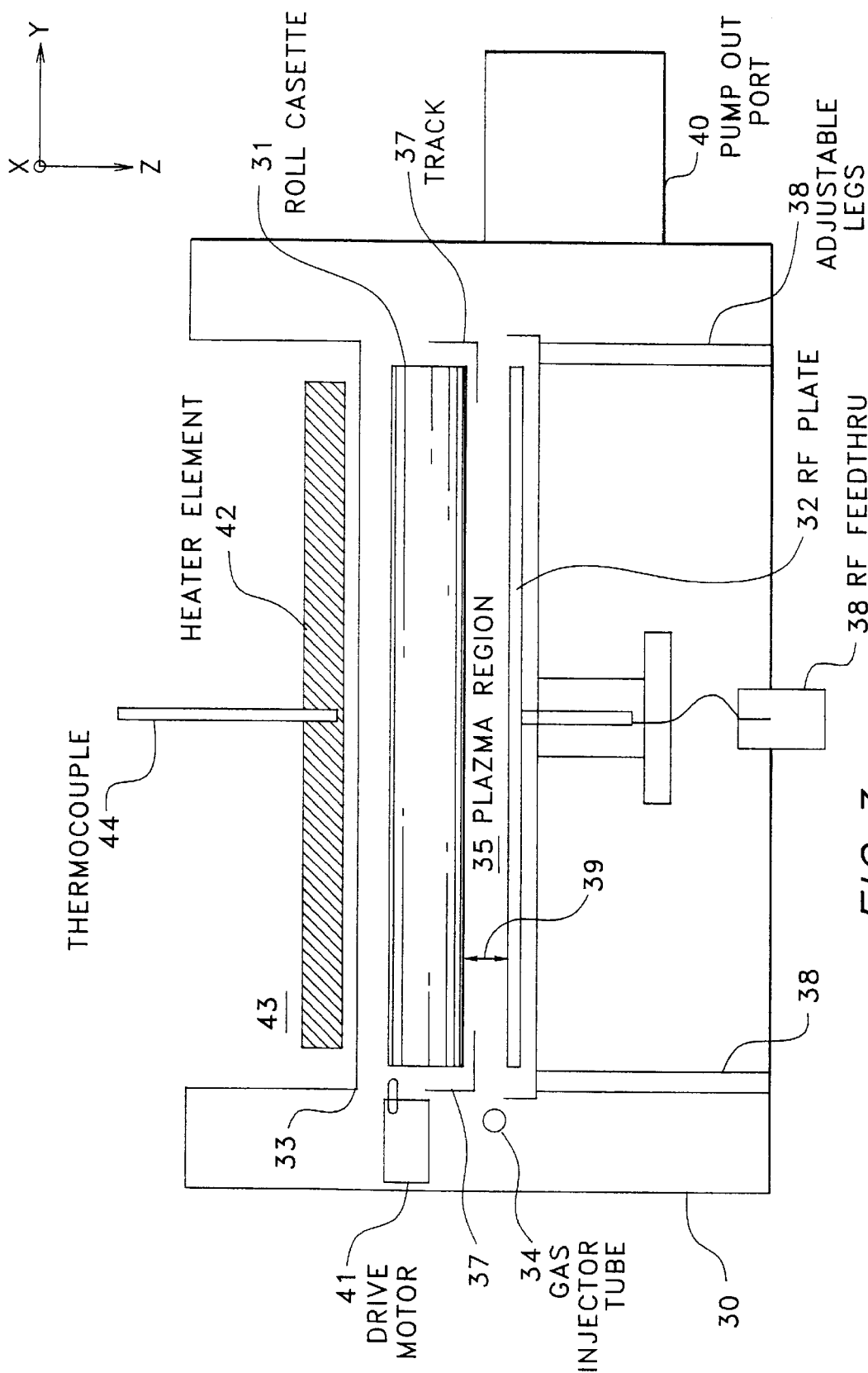
FIG. 3 shows one of the three vacuum deposition chambers that are shown in FIG. 1 wherein this chamber includes a substrate cassette in accordance with the invention.

FIG. 3 shows one of the FIG. 1 or FIG. 2 vacuum deposition chambers. Vacuum deposition chamber 30 of FIG. 3 is a PECVD chamber wherein a substrate cassette 31 in accordance with the invention is shown in its horizontal operative position between a RF plate 32 and the upper metal wall 33 of vacuum chamber 30. A gas injector tube 34 provides a gas, such as silane, from which a plasma region 35 is formed by operation of RF plate 32 and its RF feedthru 36.

Cassette 31 is physically supported in an essentially horizontal X-Y plane by operation of two parallel and physically spaced track members 37. A number of parallel and vertically adjustable legs 38 are provided to enable adjustment of the vertical distance 39 that exists between RF plate 32 and cassette 31. A pump-out port 40 enables the vacuum within chamber 30 to be controlled as above mentioned.

In FIG. 3, cassette 31 is oriented such that its two reels extend parallel to the plane of the figure; that is, in the Y-direction. In this case, movement of the web-like substrate is in the X-Y plane. As above mentioned, two drive motors are provided to respectively control the two reels that are within cassette 31 (see motors 40 and 41 of FIG. 5). One of these two drive motors 41 is shown in FIG. 3. The other drive motor is directly behind motor 41 and is hidden from view by motor 41.

Usually, it is desirable to control the operating temperature of chamber 30 and for this purpose, an externally-located heater element and its insulation 42 are located in a well or cavity 43 that is located at the top of chamber 30. A thermocouple 44 and a temperature control circuit (not shown) operate to control heater 42 so as to maintain chamber 30 at a desired deposition temperature.

Figure 4:
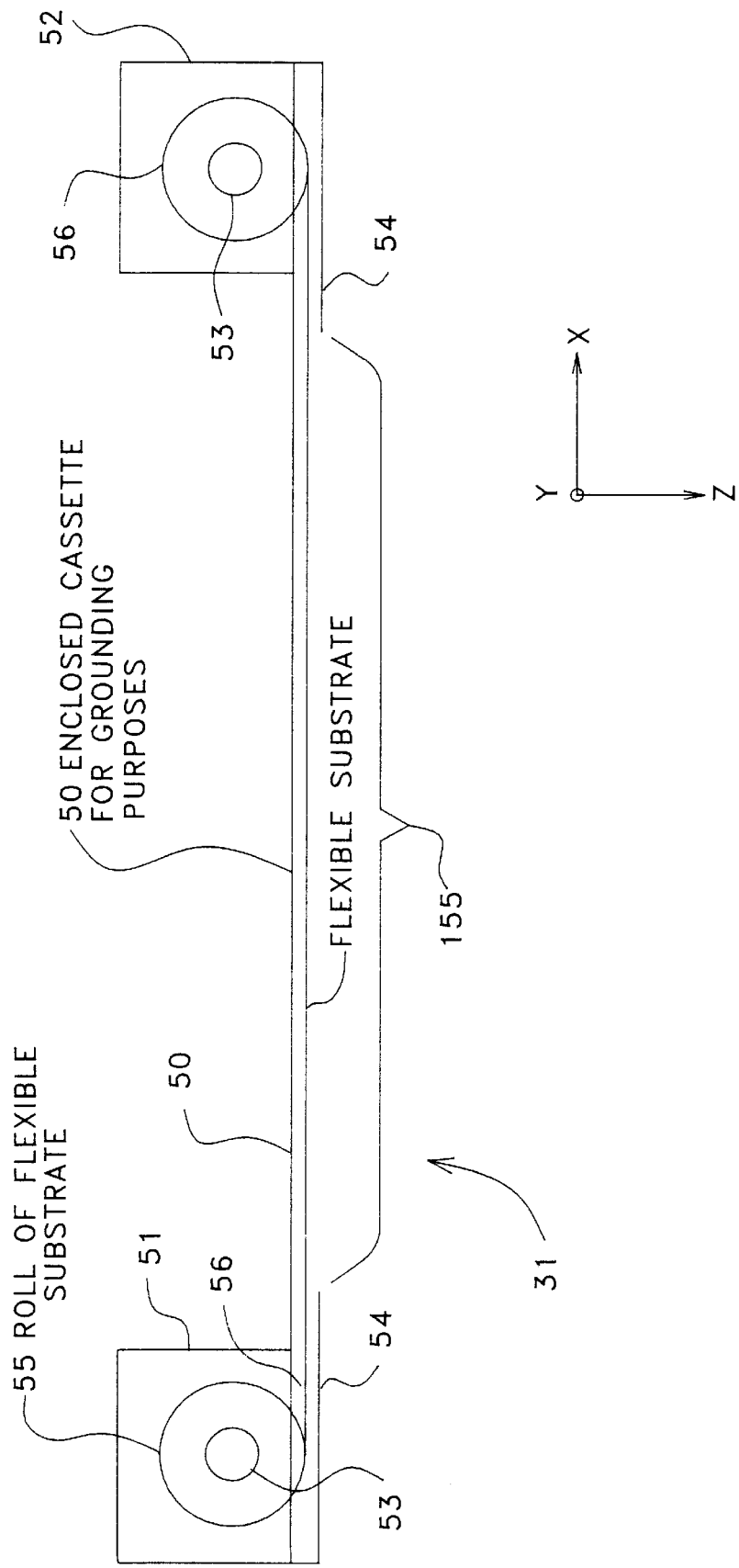
FIG. 4 is an enlarged side view of the cassette that is seen in FIG. 3.

FIG. 4 is an enlarged view of cassette 31 as seen from the side of FIG. 3; that is, as seen in the X-Z plane. Cassette 31 includes a housing that is formed of an electrically-conductive material for grounding purposes. Cassette 31 comprises a horizontally-extending upper wall 50 that extends between two elongated end housings 51 and 52 that are generally square in cross-sectional shape, and whose central axis 53 are parallel and extend in the Y-direction. Each of these two end housings 51, 52 include a bottom and horizontally-extending wall 54 that define a deposition opening area 155.

Housing 52 contains a first roll 55 of a flexible substrate material 56 that extends through deposition opening 155, and terminates at a second roll 56 that is contained within housing 52. If roll 55 is considered to be the above-described supply roll, then roll 56 is the take-up roll. The length of the substrate web that is currently resident in deposition opening 155 is a relatively short substrate length upon which deposition occurs.

While the invention is not to be limited thereto, it is preferred that the substrate web move continuously through deposition area 155 at a controlled rate so that all portions of the substrate web are subjected to identical deposition characteristics. Without limitation thereto, the size of deposition opening 155 in an embodiment of the invention was about 1 foot by 1 foot, whereas the length of the substrate web was about 100-feet.

Figure 5:
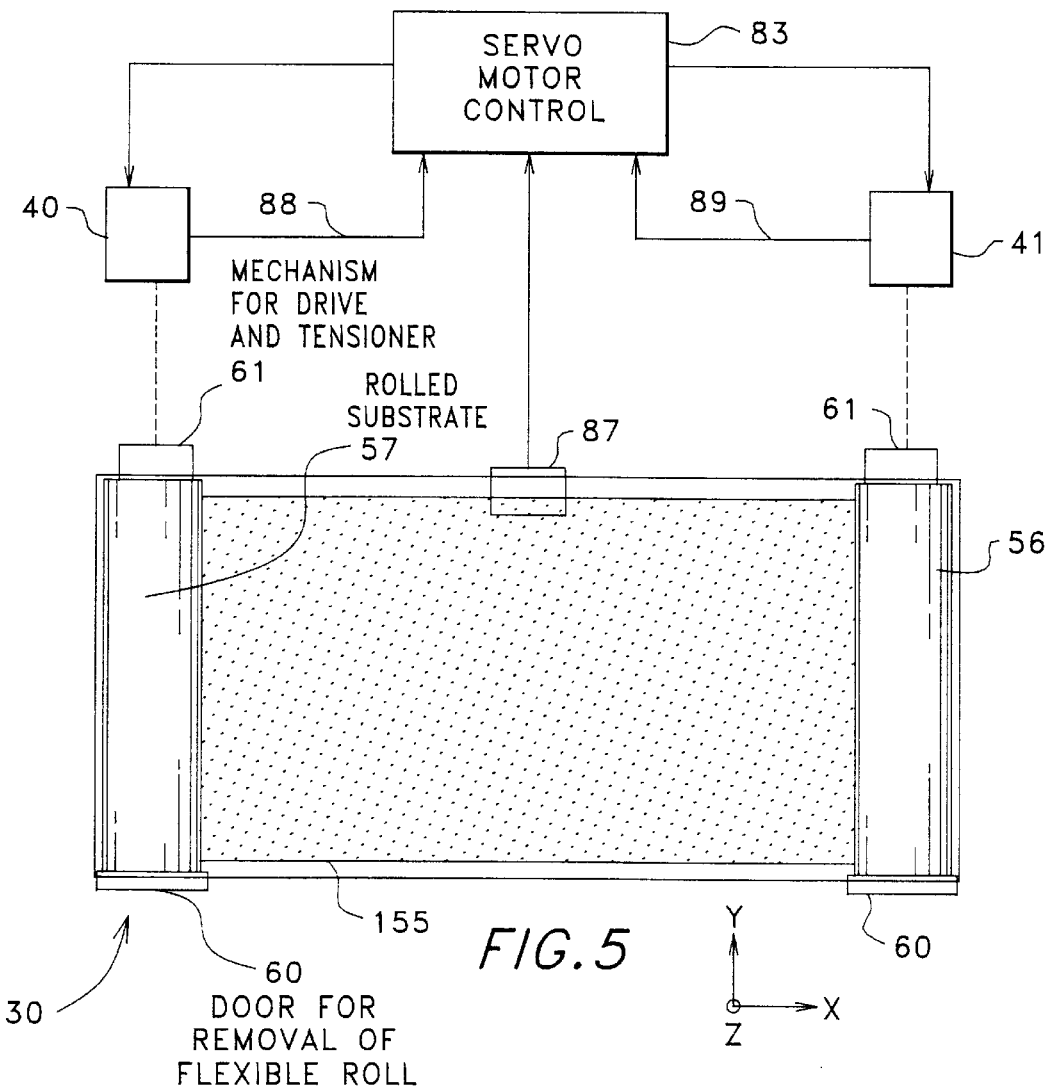
FIG. 5 is a bottom view of the FIG. 4 cassette.

FIG. 5 is a bottom view of cassette 31 as seen in FIG. 4. This view shows two doors 60 that are provided on the non-motor-drive side of the cassette to facilitate the insertion and removal of substrate rolls 56 and 57 from cassette 31. This view also shows two drive mechanisms that engage with two motors 40 and 41 that operate to maintain the deposition run 155 of the substrate under tension so that this deposition run of the substrate occupies an essentially flat horizontal or X-Y plane.

Figure 6:
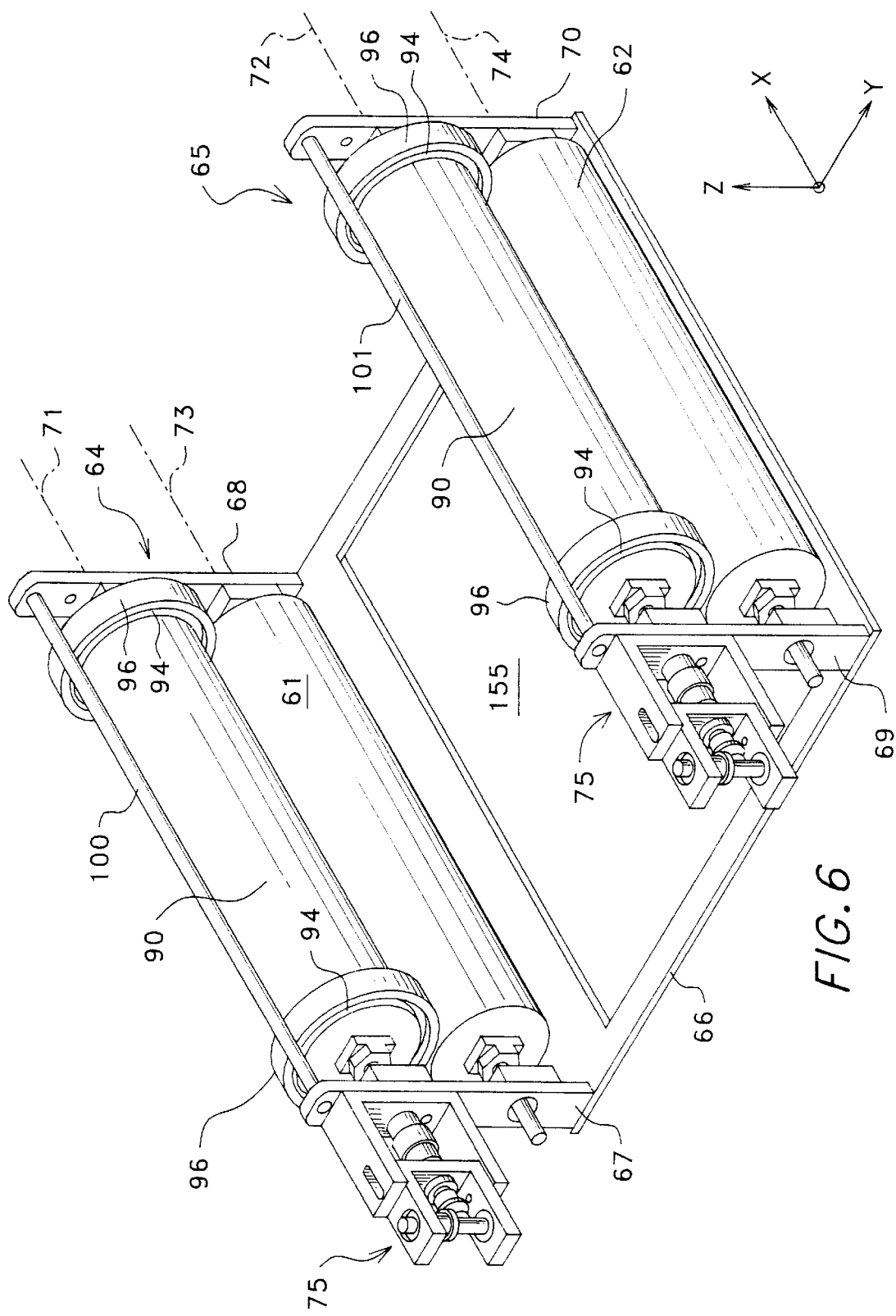
FIG. 6 is a perspective view of a cassette in accordance with the invention wherein the cassette deposition plane is accurately established by a first and a second idler roller.

FIG. 6 is a perspective view of another cassette in accordance with the invention, wherein the cassette X-Y deposition plane 155 is accurately established by a first idler roller 61 and a second idler roller 62. In this embodiment, the cassette is housing enclosed as is shown in FIG. 4. However, the cassette external housing has not been shown in FIG. 6 for purposes of convenience.

The cassette of FIG. 6 includes a rigid frame having a flat and generally square plate 66 that defines a centrally-located opening or window 155 that corresponds to the cassette's X-Y deposition plane. In a non-limiting embodiment of the invention, window 155 was about 1 foot by 1 foot square. Four rigid and parallel arms 67–70 stand upward and perpendicular from the four corners of plate 66, and the tops of these arms are securely maintained by operation of two rigid shafts 100, 101. Arms 67 and 68 provide support for a first motor-driven substrate reel 64 and its underlying first idler roller 61, whereas arms 69 and 70 provide support for a second independently motor-driven substrate reel 65 and its underlying second idler roller 62, all of which are bearing supported within the respective arms 67–70.

In this embodiment of a cassette in accordance with the invention, idler rollers 61 and 62 are mounted to ensure that the relatively short length of the substrate web that extends between these two idler rollers is always at a fixed and constant X-Y deposition plane, a short distance above window 155.

Substrate reels 64 and 65 are motor driven about their respective axes 71 and 72, whereas idler rollers 61 and 62 freely rotate about their respective axes 73 and 74, all four axes of which are parallel, axes 71, 73 of which lie in a common X-Z plane, and axes 72, 74 of which lie in a second common X-Z plane.

While the manner of independently driving reels 64 and 65 is not critical to the invention, FIG. 6 shows a gear configuration 75 that is associated with each of these two reels. In this manner, these two reels are independently driven by two electric motors 40, 41 as shown in FIG. 5.

As shown in FIG. 5, and in accordance with a feature of the invention, the two electric motors 40, 41 are servo controlled by the operation of a control means 83 so as to maintain the relatively short length of the substrate that extends between the two idler rollers 61, 62 under a constant tension, thereby ensuring that the cassette deposition plane 155 does not change as the effective diameter of the supply reel decreases, and as the effective diameter of the take-up reel concomitantly increases. This servo control of motors 40, 41 can be achieved by the use of two feedback signals 88, 89, and/or by the use of a sensor 87 that responds to any Z-direction movement of this short length of the substrate away from the cassette's X-Y deposition plane 155. In an embodiment of the invention, deposition plane 155 was maintained as a flat X-Y plane within plus or minus 1 mm.

Figure 7:
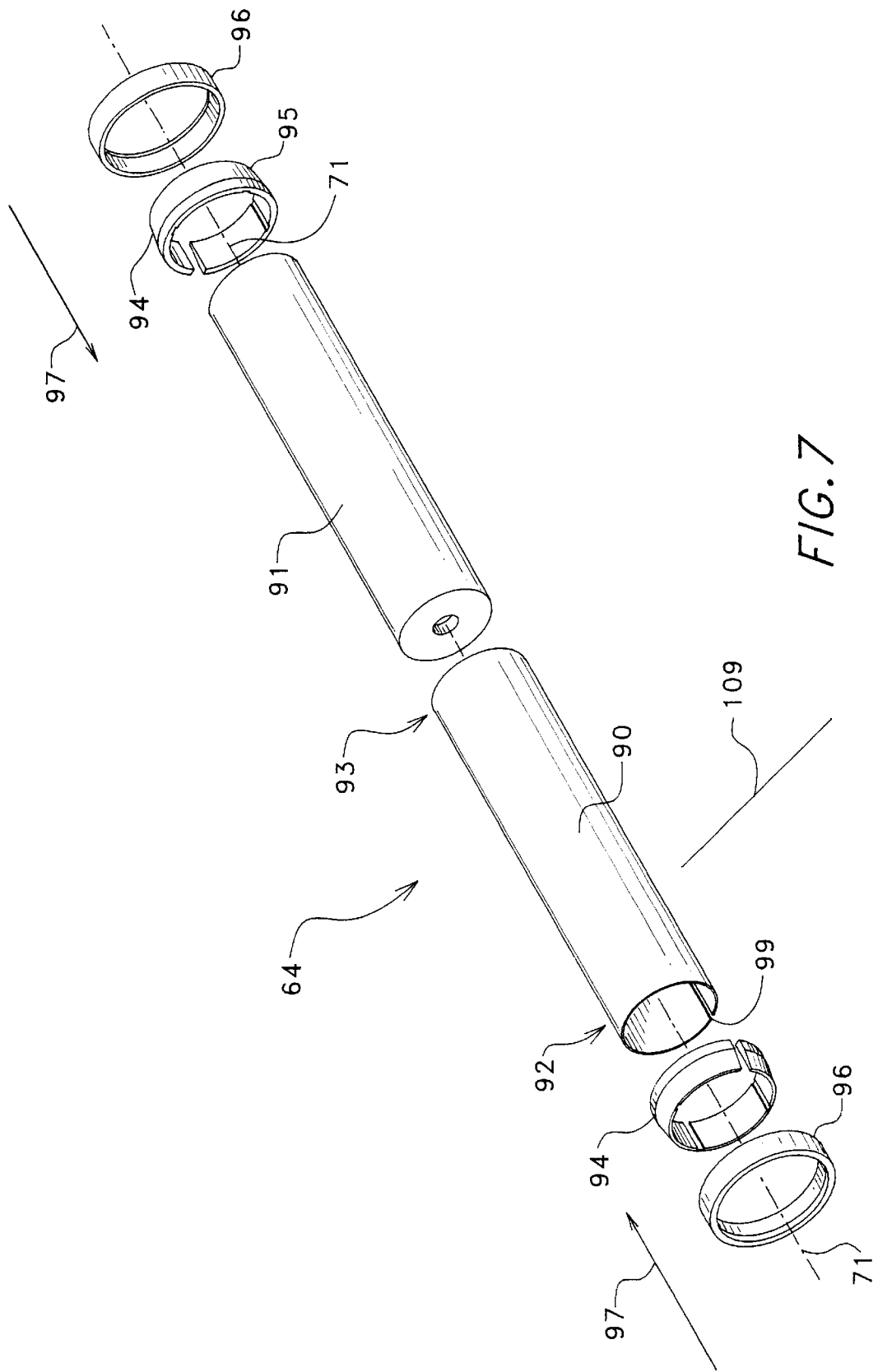
FIG. 7 is an exploded view that shows how the supply and take-up reels of FIG. 6 are each constructed and arranged to capture and securely hold an end of the cassette substrate web.

FIG. 7 is an exploded view that shows how the two supply and take-up reels 64 and 65 of FIG. 6 are constructed and arranged in accordance with a feature of the invention in order to capture, and securely hold, the two opposite ends of the cassette relatively long substrate web; for example, the two 1 foot wide ends of a substrate web that is 100 feet long. While FIG. 7 shows the construction of only reel 64, the two reels 64, 65 are of identical construction.

The outer cylindrical surface of reel 64 is covered by an axially split and relatively rigid metal cylindrical cover 90. In an embodiment of the invention, cover 90 was stainless steel about 0.35-inch thick. Cover 90 has an inner diameter that is only somewhat larger that the outer diameter of an underlying reel member 91 that is motor driven as above described. However, cover 90 relatively freely slides over the cylindrical outer surface of motor-driven reel member 91.

The external surfaces at the two axial ends 92, 93 of cover 90 each carry a C-ring 94 having an annular ramp 95 that faces downward in the direction of a clamp ring 96. In operation, a 1 foot wide end of the substrate web (for example, a squared-off end) is manually inserted into an axially extending slit 99 that is formed in cover 90, and thereby under a portion of cover 90 so that this end of the substrate web physically engages the outer surface of cylindrical member 91, and the inner surface of cylindrical cover 90.

In this position, the longitudinal axis 109 of the substrate extends perpendicular to the axis 71 of reel 64. The two clamp rings 96 are now moved in a direction that is indicated by arrows 97. In so moving, clamp rings 96 radially compress both of the C-rings 94 and the underlying cylindrical cover 90 so as to capture the end of the substrate web.

Figure 8:
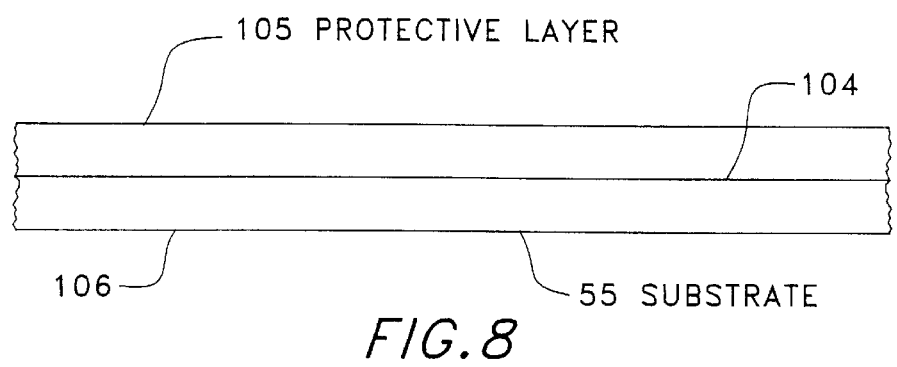
FIG. 8 shows an embodiment of the invention wherein the side of the substrate web that faces away from FIG. 6 deposition window includes a protective layer that operates to protect the deposition side of the web when the web is wound about a reel.

FIG. 8 shows an embodiment of the invention wherein the side 104 of substrate 55 that faces away from FIG. 6 deposition window 56 includes a 100 foot long and 1 foot wide protective layer 105 of a relatively thin and inert plastic material that operates to protect the deposition layer(s) that is on the side 106 of the substrate web when the web is wound about a take-up reel.

Embodiments of the invention above described relate primarily to the FIG. 1 and FIG. 2 multi-chamber deposition systems and to the single-chamber system of FIG. 3, which embodiments might be called horizontal deposition embodiments. However, this is not to be taken as a limitation on the spirit and scope of this invention. For example, the systems of FIGS. 1, 2 and 3 may comprise vertical deposition systems; for example, systems wherein the length of the substrate web upon which deposition takes place occupies a generally vertical plane.

Figure 9:
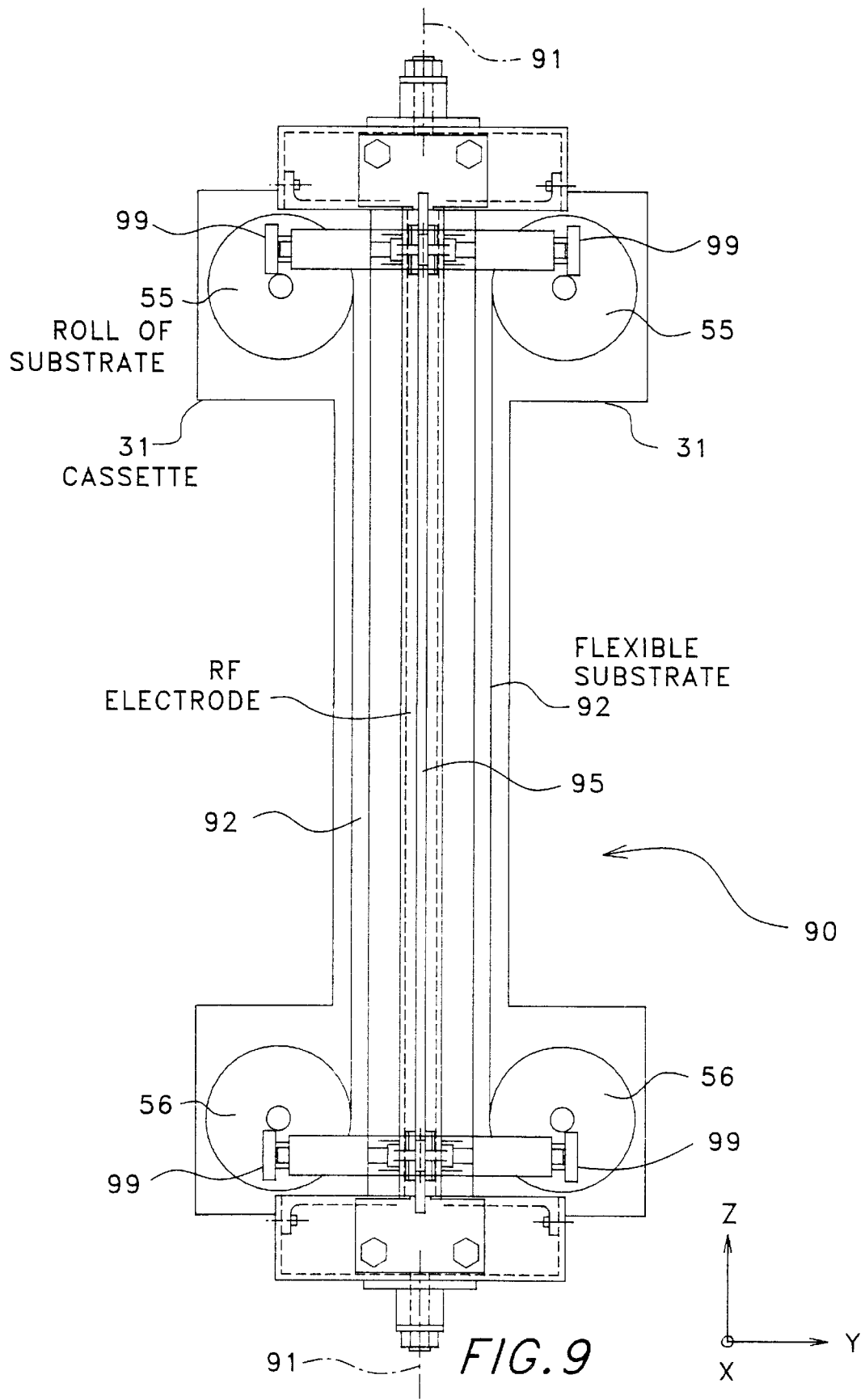
FIG. 9 shows a vertically-oriented vacuum deposition chamber wherein the chamber includes two vertically-oriented substrate cassettes in accordance with the invention.

FIG. 9 is a partial showing of a vertically-oriented deposition chamber 90 in accordance with the invention, this construction and arrangement providing a high gas utilization rate. Chamber 90 includes two vertically-oriented substrate cassettes 31 that are constructed and arranged, as above described, in accordance with the invention. That is, the relatively short deposition run 92 of the substrate web that is within each of the two cassettes 31 occupies a vertical or X-Z plane.

The construction of chamber 90 is generally symmetrical on each side of a vertically-extending X-Z plane 91, and for convenience, the outer housing of deposition chamber 90 is not shown. Chamber 90 may be a stand-alone chamber having function above described relative to FIG. 3, or a number of such chambers 90 may be used to provide a vertical or a horizontal multi-chamber system having functions described relative to FIGS. 1 and 2.

In FIG. 9, the two vertical substrate runs 92 are processed at the same time by utilizing a single RF plate 95, a single gas injector (not shown), and a single pump-out port (not shown), all of which are located generally on centrally-located X Z plane 91, thus effectively providing two side disposed deposition chambers that can be accessed by way of gate valves (not shown). In addition, each horizontal side of chamber 90 may include its own heater (not shown).

As above described, each of the two cassettes 31 includes a first substrate reel 55 and a second substrate reel 56, these four reels being independently motor driven as above described by way of four gear trains 99. Two individual cassette transport systems (not shown) can be provided to individually transport each of the two cassettes 31, or a single transport system (not shown) can be provided to transport both cassettes 31.

Without limitation thereto, advantages of the above-described invention include (1) Independent substrate web processing can be provided in each of a plurality of deposition chambers; (2) No cross-contamination occurs as independent processing of the substrate web progresses; (3) Deposition chambers in accordance with the invention can be used to process a rigid substrate member having a size of about 12×12-inches (or larger), or can also be used to process a flexible substrate web that is about 12-inches wide (or narrower/wider) and about 100-feet long (or shorter/longer); (4) The inclusion of a redundant chamber(s) in a deposition system in accordance with the invention reduces system down time; (5) The deposition chambers are useful in a wide variety of deposition technologies, such as amorphous silicon, micro-crystalline silicon, poly-silicon, copper indium selenides and its variants, CdTe, etc., (6) The cost of a deposition process is substantially less, thus providing a lower semiconductor product cost; (7) Multiple semiconductor layers can be deposited in any desired sequence by using the deposition chambers in any desired deposition sequence; and (8) The invention can be used to fabricate advanced electronic device structures, including, but not limited to, solar cells, thin film transistors, sensor arrays, X-ray detectors, etc.

While the invention has been described in detail while making reference to various embodiments thereof, it is known that those skilled in the art will, upon learning of this invention, visualize yet other embodiments that are within the spirit and scope of this invention. Thus, the above detailed description is not to be taken as a limitation on the spirit and scope of this invention.

What is claimed is:

1. A deposition system comprising:
   a unitary substrate cassette having a first reel and a second reel that independently rotate on parallel and physically-spaced axes;
   said first and second reels being physically spaced to define a relatively short deposition plane at a location between said first and second reels;
   a relatively long and flexible substrate web having a major portion thereof wound about said first reel, having an exposed end thereof connected to said second reel, and having a relatively short intermediate length thereof exposed at said deposition plane;
   at least one generally closed deposition chamber entirely containing said substrate cassette, said at least one deposition chamber being selected from the group semiconductor deposition camber, metal deposition chamber and transparent conducting oxide deposition chamber; and
   drive means connected to said first and second reels for advancing said substrate web between said first and second reels as at least one material-layer is deposited on substantially the entire length of one side surface of said substrate web.

2. The deposition system of claim 1 including:
   a first idler roller mounted at a fixed position relative to said first reel, said first idler roller rotating on an axis that extends parallel to an axis of said first reel; and
   a second idler roller mounted at a fixed position relative to said second reel, said second idler roller rotating on an axis that extends parallel to an axis of said second reel;
   said first and second idler rollers having said substrate web threaded thereover and being physically spaced to define said relatively short intermediate length of said substrate web at a location between said first and second idler rollers.

3. The deposition system of claim 1 wherein each of said first and second reels includes:
   a centrally located and cylindrical driven member;
   a hollow cylindrical member encircling said driven member with an internal cylindrical surface of said hollow cylindrical member generally in physical engagement with an external cylindrical surface of said driven member;
   an axially-extending slit formed in said hollow cylindrical member;

one end of said substrate web being inserted into the axial slit of the hollow cylindrical member of said first reel;

an opposite end of said substrate web being inserted into the axial slit of the hollow cylindrical member of said second reel; and means applying a radially inward force to the hollow cylindrical members of said first and second reels to thereby secure said ends of said substrate web between said internal cylindrical surfaces of said hollow cylindrical members and said external cylindrical surfaces of said driven members.

4. The deposition system of claim 3 including:

a first idler roller mounted at a fixed position relative to said first reel, said first idler roller rotating on an axis that extends parallel to an axis of said first reel;

a second idler roller mounted at a fixed position relative to said second reel, said second idler roller rotating on an axis that extends parallel to an axis of said second reel;

said first and second idler rollers being spaced to define said deposition plane at a location between said first and second idler rollers; and said substrate web extending over said first and second idler rollers to define a relatively short deposition-plane on one surface of said substrate web.

5. The deposition system of claim 4 including:

a first motor connected to control rotation of said centrally located and cylindrical driven member of said first reel;

a second motor connected to control rotation of said centrally located and cylindrical driven member of said second reel, and means controlling said first and second motors in a manner to advance said substrate web between said first and second idler rollers and concomitantly maintain a substantially constant tension in said relatively short intermediate length of said substrate web.

* * * * *